(12) United States Patent
Subramanian et al.

(10) Patent No.: US 6,309,955 B1
(45) Date of Patent: Oct. 30, 2001

(54) METHOD FOR USING A CVD ORGANIC BARC AS A HARD MASK DURING VIA ETCH

(75) Inventors: Ramkumar Subramanian; Fei Wang; Todd P. Lukanc, all of San Jose; Lynne A. Okada, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/784,065

(22) Filed: Feb. 16, 2001

(51) Int. Cl.$^7$ ................................................ H01L 21/4763
(52) U.S. Cl. ...................... 438/618; 438/624; 438/636; 438/637
(58) Field of Search ...................... 438/618–681

(56) References Cited

U.S. PATENT DOCUMENTS

| 5,880,018 | * | 3/1999 | Boeck et al. | 438/619 |
| 6,184,142 | * | 2/2001 | Chung et al. | 438/692 |
| 6,197,681 | * | 3/2001 | Liu et al. | 438/637 |

* cited by examiner

*Primary Examiner*—Jey Tsai

(57) ABSTRACT

A method for forming a via of a metal interconnect structure in a semiconductor device employs a CVD organic BARC between a low k dielectric material and a via photoresist mask. The CVD organic BARC is deposited over the low k dielectric film and protects the film during formation and patterning of the via photoresist mask. Furthermore, the presence of the BARC permits the photoresist mask to be thinner than that used in conventional techniques thereby improving lithography resolution.

10 Claims, 4 Drawing Sheets

METHOD FOR USING A CVD ORGANIC BARC AS A HARD MASK DURING VIA ETCH

FIELD OF THE INVENTION

The present invention relates to the formation of metal interconnection layers during the manufacture of semiconductor devices, and more particularly to reducing the thickness of a photoresist mask used to form a via hole.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising of at least one conductive pattern, forming an opening in the dielectric layer by conventional photolithographic and etching techniques and filling the opening with conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with conductive material, typically a metal, to simultaneously form a conductive plug and electrical contact with a conductive line.

In efforts to improve the operating performance of a chip, low k dielectric materials have been increasingly investigated for use as replacements for dielectric materials with higher-k values. Lowering the overall k values of the dielectric layers employed in the metal interconnect layers lowers the RC of the chip and improves its performance. However, low k materials such as benzocyclobutene (BCB), hydrogen silsesquioxane (HSQ), SiOF, etc., are often more difficult to handle than traditionally employed higher k materials, such as an oxide. For example, low k dielectric materials are readily damaged by techniques used to remove photoresist materials after the patterning of a layer. Hence, a feature formed in a low k dielectric layer may be damaged when the photoresist mask used to form the feature (e.g., trench or via) is removed.

Other problems that have been observed when working with low k materials is that of via poisoning and resist scumming. For example, via poisoning may be observed after the formation of a via in a low k dielectric layer and the subsequent formation and patterning in the photoresist that forms the trench mask. The via poisoning may cause a mushroom shape of resist to form at the top of the via hole, and resist scum may be seen at the surface of the dielectric layer in the mask opening. An example of this is depicted in FIG. 1. A substrate 10, which may be a conductive material such as copper, is covered by a bottom etch-stop layer 12, which can be made of silicon nitride, for example. The low k dielectric layer 14 has been formed on the bottom etch stop layer 12. A cap layer 16, formed from silicon oxide, for example, covers the low k dielectric layer 14. The via hole 20 was previously formed in the low k dielectric layer 14. Upon deposition and patterning of the photoresist material 18, the mushroom shape 22 is observed due to the via poisoning. It is thought that the photoresist deposition and patterning process produces outgassing from the low k dielectric layer 14 to produce mushroom feature 22 and resist scum 24 within the trench pattern opening 26.

The outgassing prevents the resist from properly getting into the via hole 20 so that it piles up on top of the via hole 20. This outgassing problem leads to improperly formed topology on the wafer. The resist around the via hole 20 becomes very thick and difficult to pattern. When attempts are made to pattern and expose it, that area can not be exposed properly.

Attempts have been made to mitigate the via poisoning and resist scumming problem. One of these is to provide a baking step before the formation of the trench mask layer. Although this has been seen to help the via poisoning problem, it does not substantially eliminate the problem. Other methodology that has been attempted is to provide spin-on organic BARC in the via, but the relatively low adhesion of this material to the via sidewalls and bottom has caused this approach to fail in substantially eliminating via poisoning concerns. Another method to eliminate via poisoning concerns is to provide a thick layer of oxide within the via, but this has the disadvantage of undesirably reducing the via size. Other attempts have included depositions of relatively thick layers of organic and inorganic BARCs within and on top of the via, but such attempts have the undesired effect of requiring a photoresist layer substantially as thick as the BARC layer.

The photoresist masks for forming the via and trench are typically deposited at a thickness of 5000 A or more. Such a thickness is undesirably large, resulting in less accurate patterning than that achievable with a relatively thinner photoresist layer. However, such a large thickness is needed to account for photoresist consumption during patterning and etching and to protect the underlying dielectric layers. The introduction of any additional layers underneath the photoresist masks to allow for reduction of the photoresist layer thickness should not, however, have the undesirable side effects of increasing processing time and costs or increasing the likelihood of damage to underlying layers of materials.

There is a need, therefore, for a method for formation of an interconnect structure that can reduce the thickness of a photoresist layer in an economical manner that also maintains the integrity of the dielectric layer in which a via and trench are formed.

SUMMARY OF THE INVENTION

These and other needs are met by the present invention which provides a method of forming an interconnect structure comprising the step of depositing, over a metal feature, a low k dielectric layer in which a via and trench will be formed. A bottom anti-reflective coating (BARC) is deposited by chemical vapor deposition (CVD) to cover the top surface of this dielectric layer. A photoresist mask is then deposited and patterned on the CVD BARC and the low k dielectric layer to form a via hole.

The CVD BARC that covers the dielectric layer provides a number of benefits. By the provision of the CVD BARC, the thickness of the via photoresist mask can be reduced thereby providing improved lithographic patterning resolution. The CVD BARC also performs as a hard mask in protecting the low k dielectric material from the photoresist layer. Additionally, when both the CVD BARC and the photoresist comprise organic materials, a single strip processing step can be used to remove both layers from atop the low k dielectric material.

Subsequent steps of depositing conformal layers of a BARC can be used to substantially eliminate via poisoning concerns during the formation of a metal interconnect structure employing low k dielectric material.

The foregoing and other features, aspects and advantages of the present invention will become more apparent in the following detailed description of the present invention when taken in conjunction with the accompany drawings.

DETAILED DESCRIPTION OF THE INVENTION

The present invention addresses and solves problems related to patterning a via hole and protecting the underlying low k dielectric layer during formation of the via hole. The problems are substantially solved by the present invention which provides for the deposition of a chemically vapor deposited bottom anti-reflective coating (CVD BARC) over the low k dielectric layer prior to via formation. The via photoresist mask that is then formed over the CVD BARC is unable to poison the low k dielectric material and, because of the presence of the CVD BARC, can be formed thinner than in conventional VFTL dual damascene processes. In subsequent processing steps, a conformal CVD BARC layer can be used to address problems related to via poisoning and resist scumming during formation of a trench hole.

Figure 1:
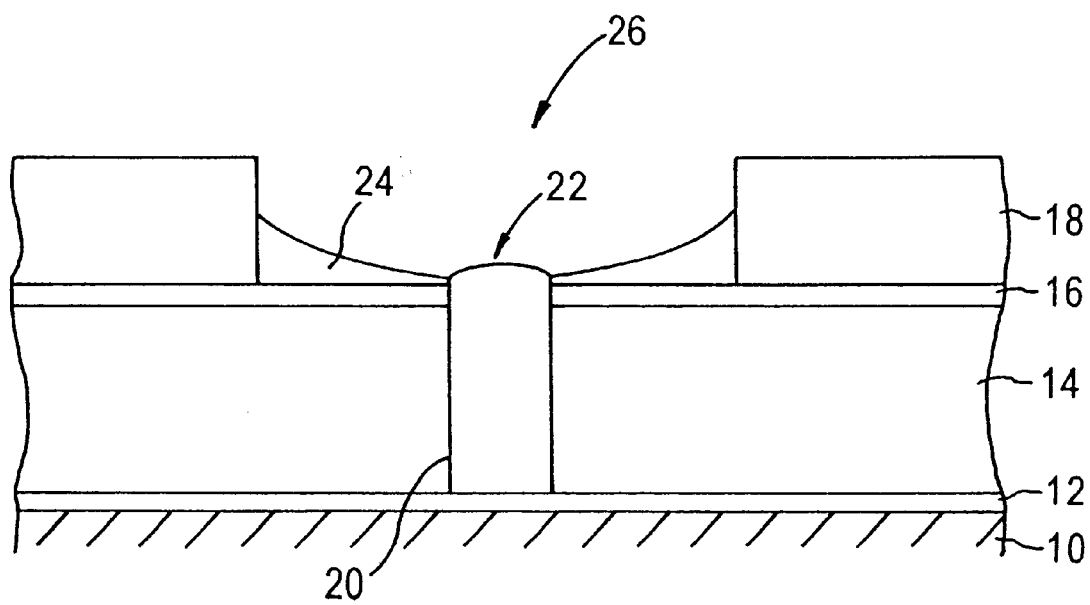
FIG. 1 is a cross-section of a metal interconnect portion that exhibits via poisoning and resist scumming after the formation of the structure in accordance with prior methodology.
Figure 2A:
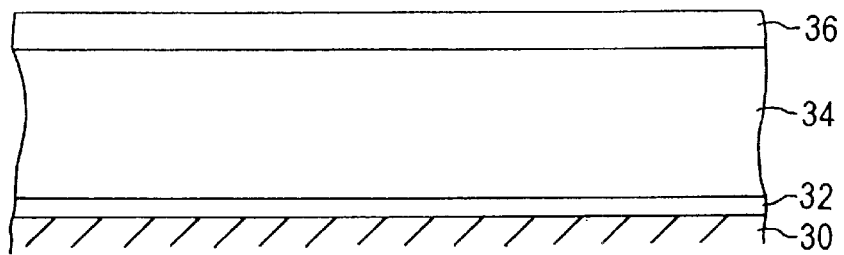
FIG. 2A is a cross-section of a metal interconnect portion after chemical vapor deposition of a BARC.

FIG. 2A depicts a cross-section of a portion of the metal interconnect structure formed in accordance with embodiments of the present invention. The conductive substrate 30, made of a conductive material such as copper, is protected by a bottom etch stop layer 32. A suitable material for the bottom etch stop layer 32 may be silicon nitride (SiN), for example. Other suitable etch stop layers include silicon carbide (SiC), silicon oxynitride (SiON), etc.

Figure 10:
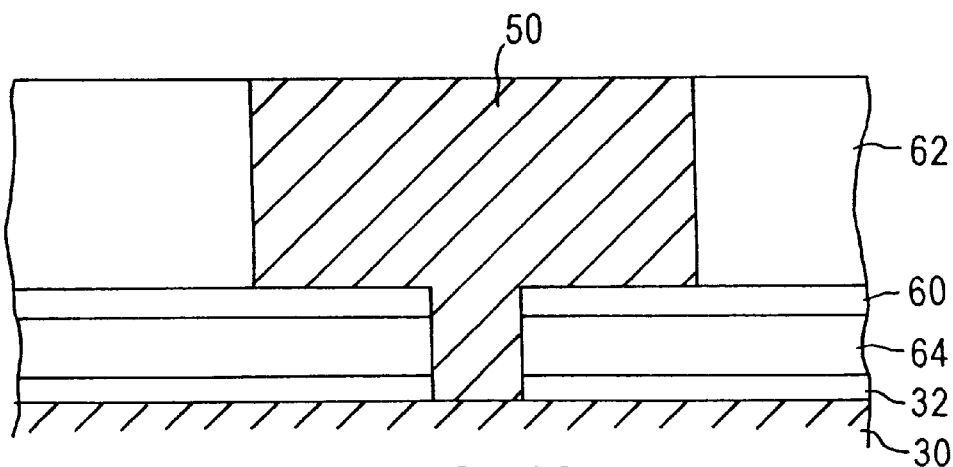
FIG. 10 depicts an alternative interconnect structure utilizing a middle etch stop layer.

A low k dielectric layer 34 has been formed upon the bottom etch stop layer 32. Low k dielectric layer 34 may be any of a number of different materials. For example, low k dielectric layer 34 may be one of a class of organic low k dielectric materials, such as benzocyclobutene (BCB), SILK, FLARE, etc. Alternatively, the low k dielectric material and low k dielectric layer 34 may comprise inorganic low k dielectric materials such as methyl silsesquioxane (MSQ), hydrogen silsesquioxane (HSQ), SiOF, etc. As shown in FIG. 2A, the low k dielectric layer 34 is a single dielectric layer comprising a single material. In other embodiments of the present invention, as depicted in FIG. 10, the low k dielectric layer 34 may be formed of two separate layers, either of two different materials or the same material. When the low k dielectric layer 34 comprises two distinct layers, an etch stop layer may be provided between the two distinct layers. The etch stop layer may be made of material such as silicon nitride, for example. If an etch stop layer is not used, however, the two distinct dielectric layers may be made of different classes of dielectric materials, such as one layer being an inorganic dielectric layer, the other layer being an organic dielectric layer. This provides etch selectivity between the distinct low k dielectric layers.

In FIG. 2A, a BARC layer 36 is depicted atop the low k dielectric material 34. The BARC layer 36 is deposited, using a chemical vapor deposition process, to a thickness of between 600 A and 1000 A. The thickness of the BARC is preferably tuned to suppress interference waves, standing waves, or both (associated with a particular wavelength of light) which are produced by one or more of the underlying layers during patterning using the photoresist mask 38 (see FIG. 2B). Without the BARC 36, such waves tend to limit the patterning and resolution capabilities of the resist mask 38.

Furthermore, when combined with the BARC 36 to pattern the underlying dielectric layer 34, the thickness of the photoresist mask can be reduced to approximately 3000 A instead of the 5500 A (or more) typically used in conventional dual damascene techniques. This relatively thinner photoresist mask has a correspondingly beneficial effect on lithographic resolution.

Figure 2B:
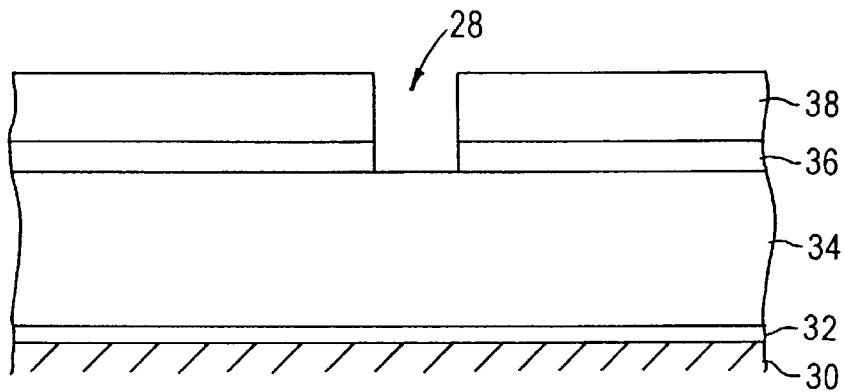
FIG. 2B depicts the cross-section of FIG. 2A following patterning of the BARC according to form a via photoresist mask.
Figure 2C:
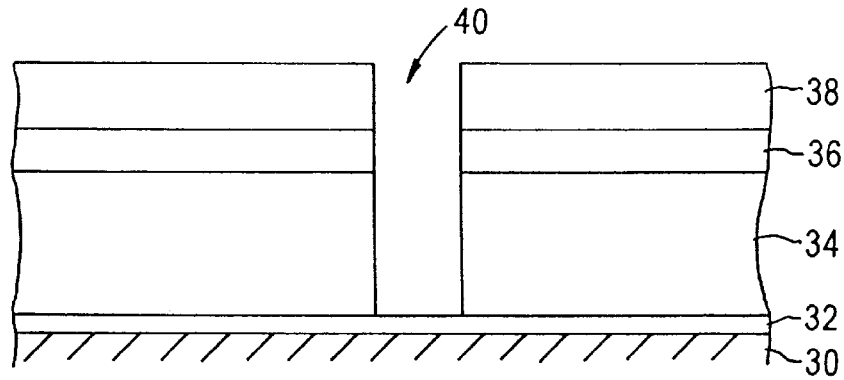
FIG. 2C depicts the cross-section of FIG. 2B during the formation of the via hole in accordance with embodiments of the present invention.

The photoresist mask 38 is deposited and patterned, as shown in FIG. 2B, to form a feature 28 that is used in formation of the via 40, as shown in FIG. 2C. The BARC layer 36 acts to protect the low k dielectric material 34 during deposition and patterning of the photoresist mask 38.

Exemplary via holes 40, as shown in FIG. 2C, can have a depth of approximately 900nm and a width in the range of 180nm. The etching of the via is selective so that the etch stops at the silicon nitride layer 32. A suitable etching chemistry for the low k dielectric layer is selected in dependence upon the particular low k material in the low k dielectric layer 34. Such etchants are well known to those of ordinary skill in the art.

Figure 3:
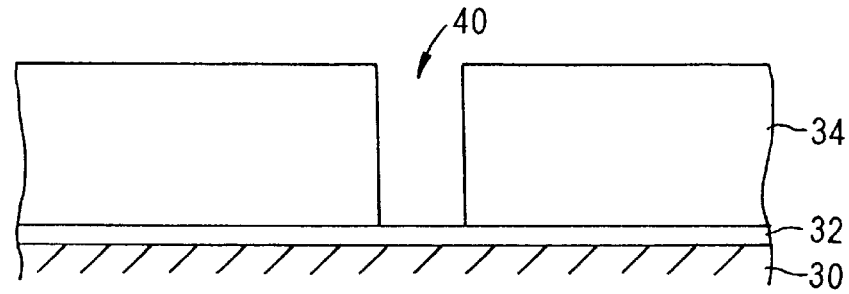
FIG. 3 depicts the cross-section of FIG. 2C following the removal of the via photoresist mask and the CVD BARC in accordance with embodiments of the present invention.

In FIG. 3, the interconnect portion is depicted after the removal of the via mask layer 38. The removal of the via mask layer 38 is accomplished by conventional photoresist removal techniques. In an embodiment in which the BARC 36 is an organic BARC, a single strip step can accomplish removal of both the photoresist 38 and the organic BARC 36. For example, an oxygen/argon mixture O2/Ar may be used or preferably, a N2/H2 mixture may be used to move the photoresist. The bottom etch stop layer 32 protects the metal in substrate 30 from contamination during this process.

To complete the interconnect structure, after the formation of the via, conventional damascene techniques can be used to form a trench and other features. Alternatively, a protective CVD BARC layer can also be used during trench formation to alleviate via poisoning and resist scumming.

Figure 4:
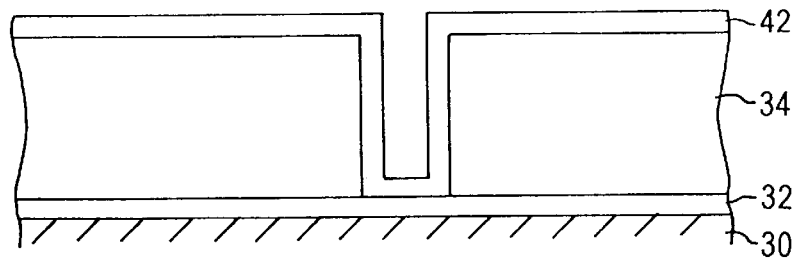
FIG. 4 depicts the cross-section of FIG. 3 following the deposition of the BARC by chemical vapor deposition in accordance with embodiments of the present invention.

FIG. 4 depicts the metal interconnect portion of FIG. 3 following CVD deposition of the BARC layer 42 within the via 40 and on top of the dielectric layer 34. The deposition of the CVD BARC 42 is a high temperature process in the preferred embodiments of the present invention and coats the appropriate portions of the metal interconnect structure with a substantially uniform film, approximately 200 A to 500 A in thickness. In certain preferred embodiments of the invention, the CVD BARC 42 that is deposited is an organic BARC, known to those of ordinary skill in the art. The CVD process is typically performed at temperatures greater than 300° C. as a plasma enhanced process. One of the advantages of a CVD process is that its high temperature aids in reducing the via poisoning problems. In contrast to other methods, the CVD organic BARC is deposited to conformally coat the via hole but is not deposited so thick as to undesirably fill the via hole.

Figure 5:
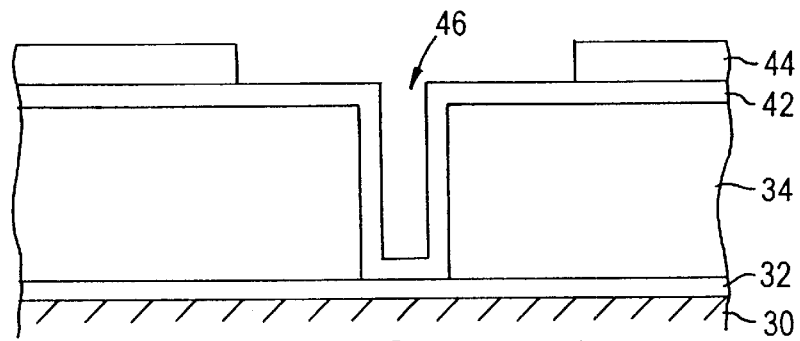
FIG. 5 depicts the metal interconnect portion of FIG. 4, after the deposition and patterning of a trench mask in accordance with embodiments of the present invention.

In FIG. 5, a photoresist layer forming a trench mask layer 44 is deposited and patterned on the CVD organic BARC layer 42. A feature 46 that is formed in the trench mask layer 44 represents the trench that will be etched into the low k dielectric layer 34. The CVD organic BARC layer 42 prevents the outgassing from the via hole and thus substantially eliminates via poisoning and resist scumming. The mushroom pattern at the top of the via hole is not observed. The photoresist layer 44 is deposited to a thickness substantially equal to that of the CVD organic BARC layer 42 (i.e., approximately 200 A to 500 A). This thickness is less than conventional photoresist layer thicknesses and benefits both the depth of focus and resolution of later lithography steps as well as reduces the etch time and the potential for consequent damage.

Figure 6:
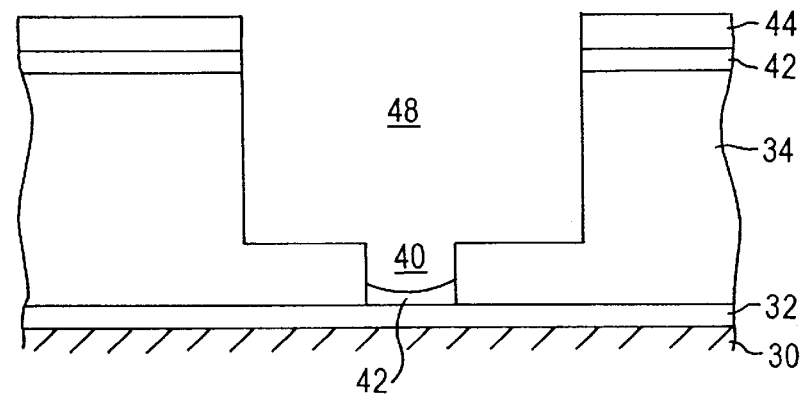
FIG. 6 depicts the metal interconnect portion of FIG. 5 after a timed etch has been performed to create a trench in the dielectric layer in accordance with embodiments of the present invention.
Figure 7:
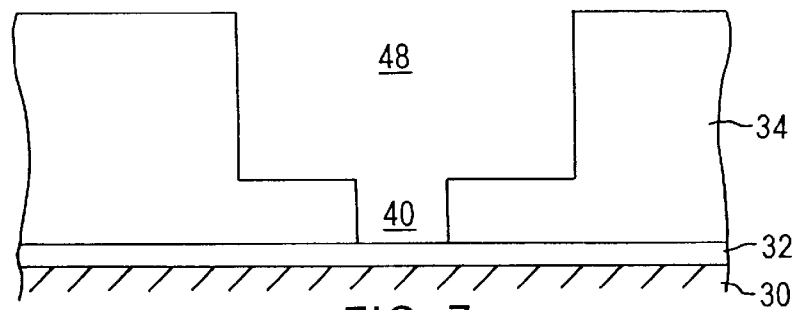
FIG. 7 depicts the metal interconnect portion of FIG. 6 following removal of the trench mask and the CVD BARC in accordance with embodiments of the present invention.

As depicted in FIG. 6, a timed etch is performed to transfer the trench pattern 46 in the trench mask layer 44 into the upper portion of the dielectric layer 34. The etching proceeds through the CVD organic BARC layer 42 and the upper portion of the low k dielectric layer 34. A suitable etching chemistry will again be selected based upon the particular dielectric material comprising the low k dielectric layer 34. Such etchants are well known to those of ordinary skill in the art. As shown in FIG. 6, a portion of the CVD organic BARC layer 42 is likely to remain within the via hole 40. This remaining portion of the CVD organic BARC layer 42 is removed, as depicted in FIG. 7, along with the photoresist in the trench mask layer 44 and the CVD organic BARC material 42 that is on top of the dielectric layer 34. The same etchant, such as N2/H2, may be used to remove the photoresist in the trench mask layer 44 and the CVD organic BARC layer 42.

Figure 8:
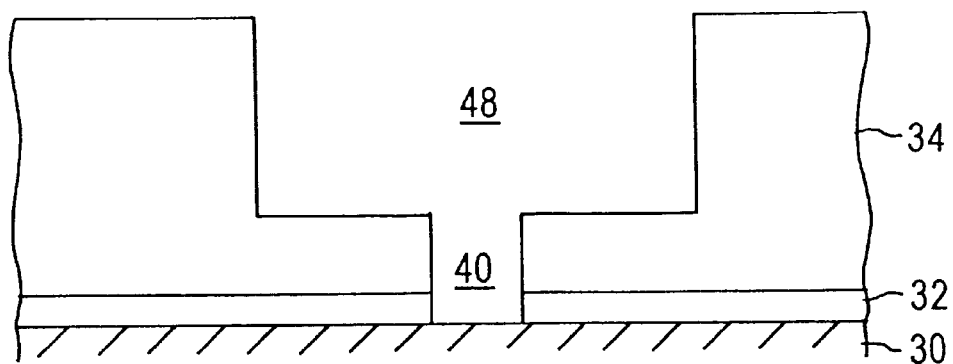
FIG. 8 depicts a metal interconnect portion of FIG. 7 after the bottom etch stop layer is removed from within the via hole in accordance with embodiments of the present invention.

In FIG. 8, the silicon nitride of the bottom etch-stop layer 32 has been removed by CHF3/N2, for example.

Figure 9:
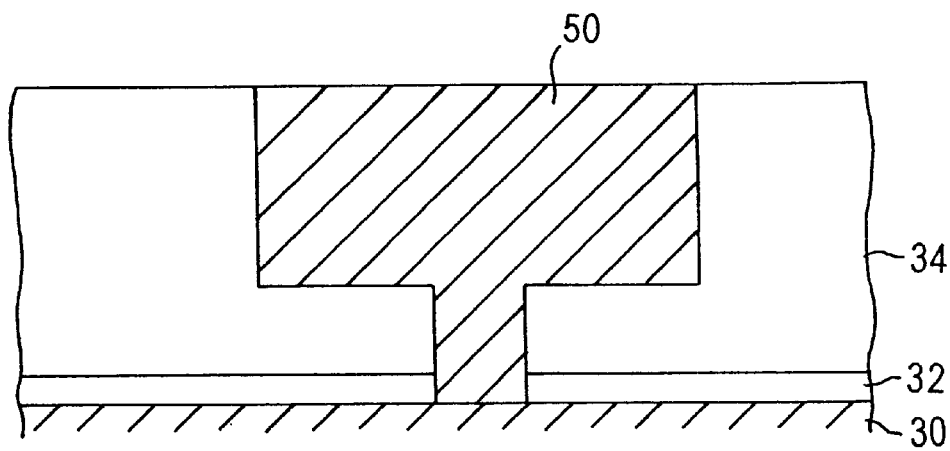
FIG. 9 depicts the metal interconnect portion of FIG. 8 after a conductive material is deposited within the trench and via hole in accordance with embodiments of the present invention.

In FIG. 9, the trench 48 and via hole 40 that have been formed in low k dielectric layer 34 are filled with conductive material, such as copper. Although, certain low k dielectric materials may form a self-diffusion barrier, in conventional practice a barrier material and a seed layer may be provided prior to the deposition of the copper. These steps are not depicted in order not to obscure the present invention.

As an alternative to the timed-etch method just described, a conventional middle etch stop layer could have been utilized, such as a nitride, silicon nitride, silicon oxynitride or silicon carbide. One of ordinary skill would understand that the via 40 (see FIG. 3) is formed by anistotropically etching a bottom dielectric layer, the middle etch stop layer, and a top dielectric layer. The deposition of the organic BARC would remain unchanged if a middle etch stop layer were to be used; however, the trench etch steps would be different. With the presence of a middle etch stop layer, the etchant chemistry is chosen to exhibit high selectivity between the top dielectric layer and the middle etch stop layer such that the trench extends substantially no further than the depth of the top dielectric layer 62, as shown in FIG. 10. An alternative to the metal interconnect structure of FIG. 9 is depicted in FIG. 10 in which the features are formed in a low k dielectric material comprising a top dielectric layer 62, a middle etch stop layer 60 and a bottom dielectric layer 64.

The CVD organic BARC layer deposited over the low k dielectric material prior to via etch allows a thinner photoresist mask to be used when patterning the via, protects the dielectric material during deposition and patterning of the photoresist, and allows a single strip step to be used to remove both the photoresist mask and the BARC layer.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a via for an interconnect structure of a semiconductor device, comprising the steps of:

forming a low k dielectric layer over a metal feature;

depositing by chemical vapor deposition (CVD) a first bottom anti-reflective coating (BARC) to cover the low k dielectric layer, wherein the first BARC is an organic BARC;

depositing and patterning a photoresist mask on the first BARC on the low k dielectric layer, the patterned photoresist mask containing an opening;

forming a via hole in the low k dielectric layer and the first BARC corresponding to the opening; and removing the first BARC and the photoresist mask in a single removal step.

2. The method of claim 1, further comprising etching the low k dielectric layer and the first BARC in accordance with the opening in the photoresist mask, such that the via hole is formed in the low k dielectric layer.

3. The method of claim 1, wherein the first BARC has a thickness between approximately 600 Å and 1000 Å.

4. A method of forming an interconnect structure, comprising the steps of:

forming a low k dielectric layer over a metal feature;

depositing by chemical vapor deposition (CVD) a first bottom anti-reflective coating (BARC) to cover the low k dielectric layer;

depositing and patterning a first photoresist mask on the first BARC on the low k dielectric layer, the first patterned photoresist mask containing an opening;

forming a via hole in the low k dielectric layer and the first BARC corresponding to the opening, the via hole having a bottom and sidewalls;

removing the first photoresist mask and the first BARC;

depositing by chemical vapor deposition (CVD) a conformal layer of a bottom anti-reflective coating (BARC) to cover the bottom and sidewalls of the via hole and a top surface of the low k dielectric layer;

depositing and patterning a second photoresist mask on the conformal BARC on the low k dielectric layer, the second patterned photoresist mask containing an opening at least partially over the via hole in the low k dielectric layer.

5. The method of claim 4, wherein the conformal BARC is an organic BARC.

6. The method of claim 4, further comprising etching the low k dielectric layer in accordance with the opening in the photoresist mask, such that a trench is formed in the low k dielectric layer over the via hole.

7. The method of claim 6, further comprising depositing conductive material in the via hole and the trench.

8. The method of claim 7, wherein the conductive material is copper or a copper alloy.

9. The method of claim 5, wherein the conformal BARC is deposited to a depth of between approximately 200 to approximately 500 Angstroms.

10. The method of claim 1, wherein the dielectric layer comprises a bottom dielectric layer, a middle etch stop layer and a top dielectric layer.

* * * * *